United States Patent
Yamashita et al.

(10) Patent No.: US 9,836,239 B2
(45) Date of Patent: Dec. 5, 2017

(54) RECORDING DEVICE AND INFORMATION PROCESSING DEVICE

(71) Applicant: Panasonic Intellectual Property Management Co., Ltd., Osaka (JP)

(72) Inventors: Hideaki Yamashita, Kyoto (JP); Takeshi Otsuka, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/067,539

(22) Filed: Mar. 11, 2016

(65) Prior Publication Data
US 2016/0283322 A1     Sep. 29, 2016

(30) Foreign Application Priority Data
Mar. 27, 2015    (JP) .................................. 2015-065876

(51) Int. Cl.
| | | |
|---|---|---|
| G06F 11/10 | (2006.01) | |
| G06F 3/06 | (2006.01) | |
| G11C 7/20 | (2006.01) | |
| G11C 29/04 | (2006.01) | |
| G11C 29/44 | (2006.01) | |

(52) U.S. Cl.
CPC .......... *G06F 3/0638* (2013.01); *G06F 3/0604* (2013.01); *G06F 3/0619* (2013.01); *G06F 3/0632* (2013.01); *G06F 3/0688* (2013.01); *G06F 11/108* (2013.01); *G11C 7/20* (2013.01); *G11C 2029/0411* (2013.01); *G11C 2029/4402* (2013.01)

(58) Field of Classification Search
CPC .................................................... G06F 11/1076
USPC ......................................... 714/773, 792, 814
See application file for complete search history.

(56) References Cited

U.S. PATENT DOCUMENTS 8,982,869 B2 *   3/2015   Oh ..................... H04N 21/4382
                                                         370/312
2012/0159051 A1    6/2012   Hida et al.

FOREIGN PATENT DOCUMENTS

JP          2012-141944          7/2012

* cited by examiner

*Primary Examiner* — Fritz Alphonse
(74) *Attorney, Agent, or Firm* — Wenderoth, Lind & Ponack, L.L.P.

(57) ABSTRACT

A recording device includes a plurality of storage modules and a recording controller. With respect to a writing request, the recording controller generates parity data and writes data in the respective plurality of modules by dividing the data. When an error is detected with respect to a reading request, data of the error is restored from data and the parity data read from other recording modules. With respect to an initialization request of the storage module, the storage module to be initialized is specified from the plurality of storage modules, and an address conversion table is initialized. Moreover, identification information for identifying the initialized storage module is held. With respect to a request for cancelling the table initialization request of the storage module, reading of data from the storage module corresponding to the held identification information is processed as an error.

6 Claims, 8 Drawing Sheets

RECORDING DEVICE AND INFORMATION PROCESSING DEVICE

BACKGROUND

1. Technical Field

The present disclosure relates to a recording device and an information processing device using the same.

2. Description of the Related Art

Unexamined Japanese Patent Publication No. 2012-141944 has disclosed a recording device incorporating a flash memory.

There has been desired a method in which using a trim that initializes a management table to thereby put all data into an unused state, a whole recording medium is returned to an initialized state to increase a writing speed and perform smoothing.

SUMMARY

The present disclosure provides a recording device and an information processing device that enable valuable data to be restored even if a request for executing an erroneous trim is made.

A recording device in the present disclosure includes a plurality of storage modules, a recording controller that controls the plurality of storage module, and a management information storage that holds identification information for identifying each of the plurality of storage modules.

Each of the storage modules includes flash memories and a flash memory controller. Each of the flash memories has table storage areas that holds data of an address conversion table, and a user data storage area that holds data of a user. The flash memory controller performs reading and writing of the data of the flash memories, and initializes the address conversion table.

The recording controller has a parity generator, an error detector, a data restorer, and an initialization controller. The initialization controller has an address conversion table initializer and a storage module selector.

With respect to a writing request of data, the parity generator generates parity data corresponding to writing data, and writes the generated parity data in any of the plurality of storage modules.

The error detector detects an error of data read from each of the plurality of storage modules as reading objects with respect to a reading request of the data.

The data restorer restores the data of the storage module with the error detected, using the data and the parity data read from the storage module other than the storage module with the error detected, when the error detector detects the error.

With respect to an initialization request to the storage module, the initialization controller specifies the storage module as an initialization object, based on the identification information held by the management information storage. The initialization controller then instructs the flash memory controller to initialize the address conversion table of the specified storage module as the initialization object. Furthermore, the initialization controller stores the identification information for identifying the storage module as the initialization object in the management information storage.

Moreover, with respect to a request for cancelling the initialization request of the storage module, the initialization controller instructs the error detector to process, as an error, data read from the storage module as the initialization object corresponding to the identification information held by the management information storage.

According to the present disclosure, there can be provided a recording device that enables original data to be restored even if initialization processing of an address conversion table is executed by a request of an erroneous trim.

DETAILED DESCRIPTION

Hereinafter, referring to the drawings as needed, exemplary embodiments will be described in detail. However, unnecessarily detailed description may be omitted. For example, detailed description of a well-known item or redundant description of substantially the same configuration may be omitted. This is to avoid unnecessary redundancy of the following description and to facilitate understanding of those in the art.

The accompanying drawings and the following description are provided for those in the art to sufficiently understand the present disclosure, and are not intended to limit the subject of the claims.

First Exemplary Embodiment

Hereinafter, a first exemplary embodiment will be described with reference to FIGS. 1 to 8.

[1-1. Configuration]

[1-1-1. Whole Configuration of Information Processing Device]

Figure 1:
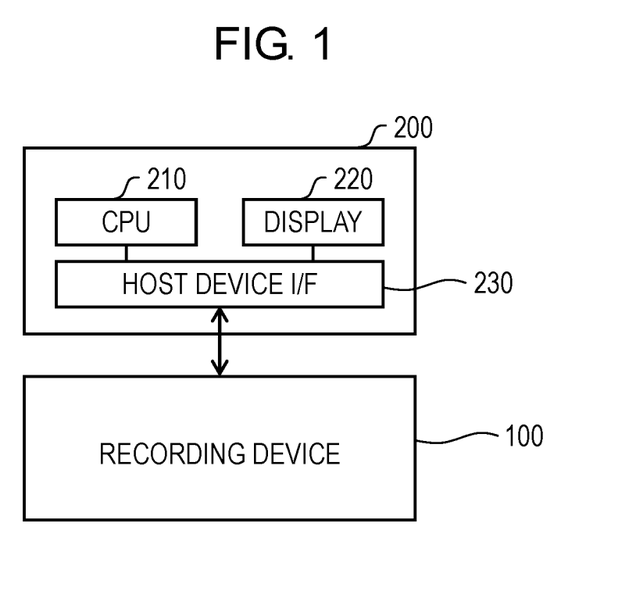
FIG. 1 is a block diagram showing a whole configuration of an information processing device in a first exemplary embodiment.

FIG. 1 is a block diagram showing a whole configuration of an information processing device in the first exemplary embodiment. The information processing device is configured by host device 200 and recording device 100. Host device 200 has CPU (Central Processing Unit) 210, display 220, and host device I/F (Interface) 230. CPU 210 controls whole host device 200. Display 220 is a display device such as a liquid crystal display and the like. Host device I/F 230 is an interface for host device 200 to access recording device 100. Host device 200 may access recording device 100 through an adaptor that performs protocol conversion or the like.

[1-1-2. Configuration of Recording Device]

Figure 2:
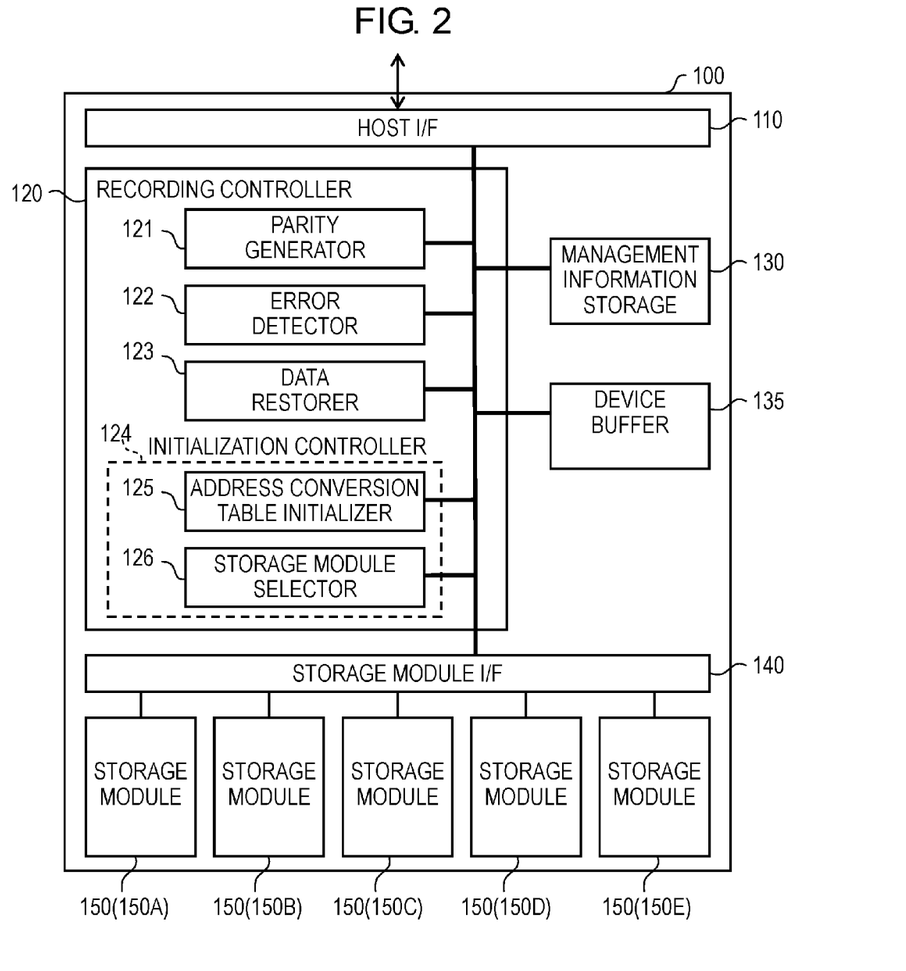
FIG. 2 is a block diagram showing a configuration of a recording device in the first exemplary embodiment.

FIG. 2 is a block diagram showing a configuration of recording device 100 in the first exemplary embodiment. Recording device 100 has host I/F 110, recording controller 120, management information storage 130, device buffer 135, storage module I/F 140, and a plurality of storage modules 150 (150A to 150E). While in the first exemplary embodiment, a form in which recording device 100 has five storage modules 150A to 150E will be described, a number of storage modules 150 is not limited to five, and only needs to be plural.

Host I/F 110 is connected to host device 200 by host device I/F 230 to perform transmission/reception of commands between host device 200 and recording device 100. Recording controller 120 controls whole recording device 100. Recording controller 120 may be configured only by hardware, or may be implemented by combining hardware and software. Recording controller 120 may be implemented by a microcomputer or the like. Management information storage 130 includes a memory. Management information storage 130 holds information for identifying initialized storage module 150 in the memory. Device buffer 135 temporarily holds data to be transmitted/received between host device 200 and storage module 150. Storage module I/F 140 is an interface to issue commands for initialization, reading of data, and writing of the data to storage module 150.

Recording controller 120 has parity generator 121, error detector 122, data restorer 123, and initialization controller 124. Initialization controller 124 has address conversion table initializer 125 and storage module selector 126.

Parity generator 121 generates parity data for restoring the data to be written in storage modules 150 to write the same in device buffer 135. Furthermore, parity generator 121 instructs writing of the parity data written in device buffer 135 to storage modules 150A to 150E via storage module I/F 140 is an error.

Error detector 122 determines whether or not the data read from storage module 150 via storage module I/F 140 is an error. Determination as to whether or not the data is an error may be made, using an error correction code (ECC). For example, when the data is written in the storage modules 150, the error correction code is given on a basis of sector. When the data is read from storage module 150, whether or not the read data is an error is determined, using this error correction code.

Data restorer 123 restores the data determined to be an error by error detector 122 into normal data, using data of storage modules 150 other than storage module 150 where the error data is stored. Restoration processing of the data will be described in detail later.

Address conversion table initializer 125 instructs initialization of address conversion table 158 to storage module 150 via storage module I/F 140.

Storage module selector 126 selects storage module 150 to be initialized. Storage module selector 126 manages management information storage 130 and uses the same to hold necessary information.

Figure 3:
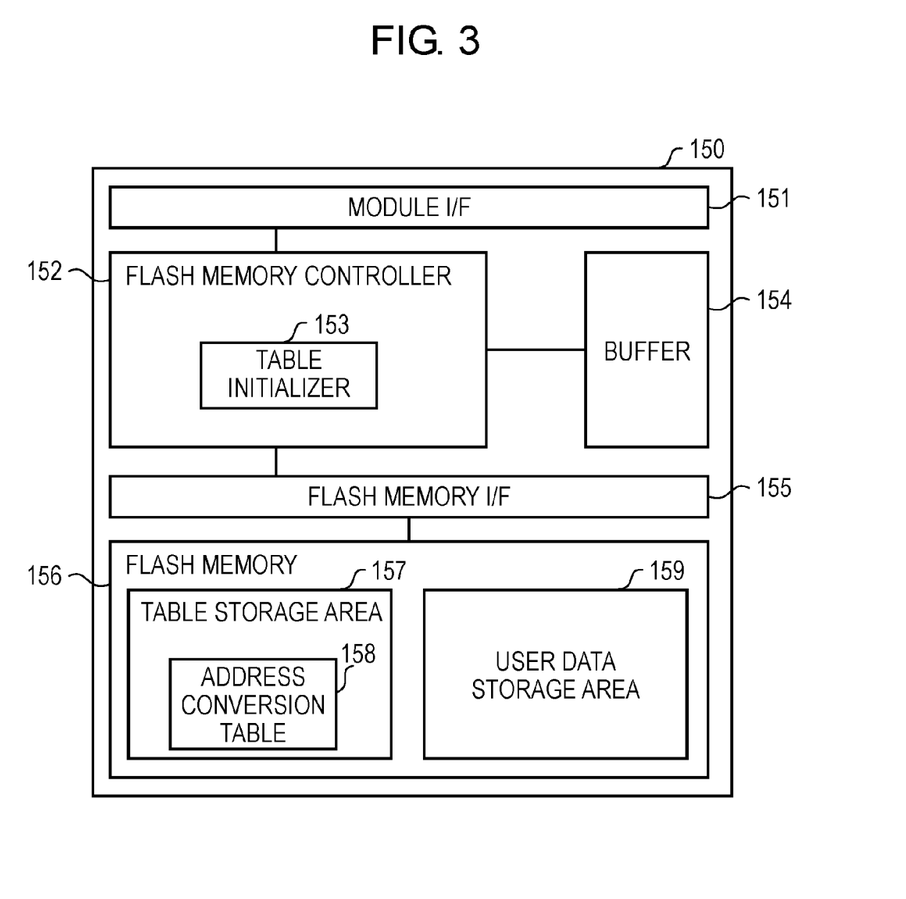
FIG. 3 is a block diagram showing a configuration of a storage module in the first exemplary embodiment.

Storage modules 150A to 150E may have a common configuration. Storage module 150 in the case of the common configuration is shown in FIG. 3. Storage module 150 has module I/F 151, flash memory controller 152, buffer 154, flash memory I/F 155, and flash memories 156.

Module I/F 151 receives a command from recording controller 120 and passes the command to flash memory controller 152. Moreover, module I/F 151 performs data transfer between recording controller 120 and buffer 154.

Flash memory controller 152 controls whole storage module 150. Flash memory controller 152 can be implemented by hardware, a microcomputer or the like. Buffer 154 temporarily holds data to be passed between recording controller 120 and flash memories 156. Flash memory I/F 155 executes initialization processing, and issues a reading request and a writing request to flash memories 156.

Flash memory controller 152 has table initializer 153. Table initializer 153 specifies an address where latest valid address conversion table 158 exists, and initializes relevant address conversion table 158.

When receiving the command for reading from recording controller 120, flash memory controller 152 reads address conversion table 158 in table storage areas 157 to find an address where data of a user (user data) exists. Thereafter, flash memory controller 152 reads the user data in user data storage area 159, based on the found address.

When receiving the command for writing from recording controller 120, flash memory controller 152 reads address conversion table 158 to specify an area where the user data is to be written. Flash memory controller 152 writes the user data in the specified area, and updates address conversion table 158.

Each of the flash memories 156 has table storage areas 157 and user data storage area 159. Each of the table storage areas 157 is an area where data of address conversion table 158 is stored, and holds management data for converting a logical address and a physical address. User data storage area 159 is an area where the data of the user (the user data) that the user reads and writes is stored. Flash memory controller 152 performs processing of the reading and the writing of the data to flash memories 156, processing of the initialization to address conversion table 158, and the like through flash memory I/F 155.

[1-1-3. Data Configuration at the Time of Initialization of Table Storage Areas]

Figure 4:
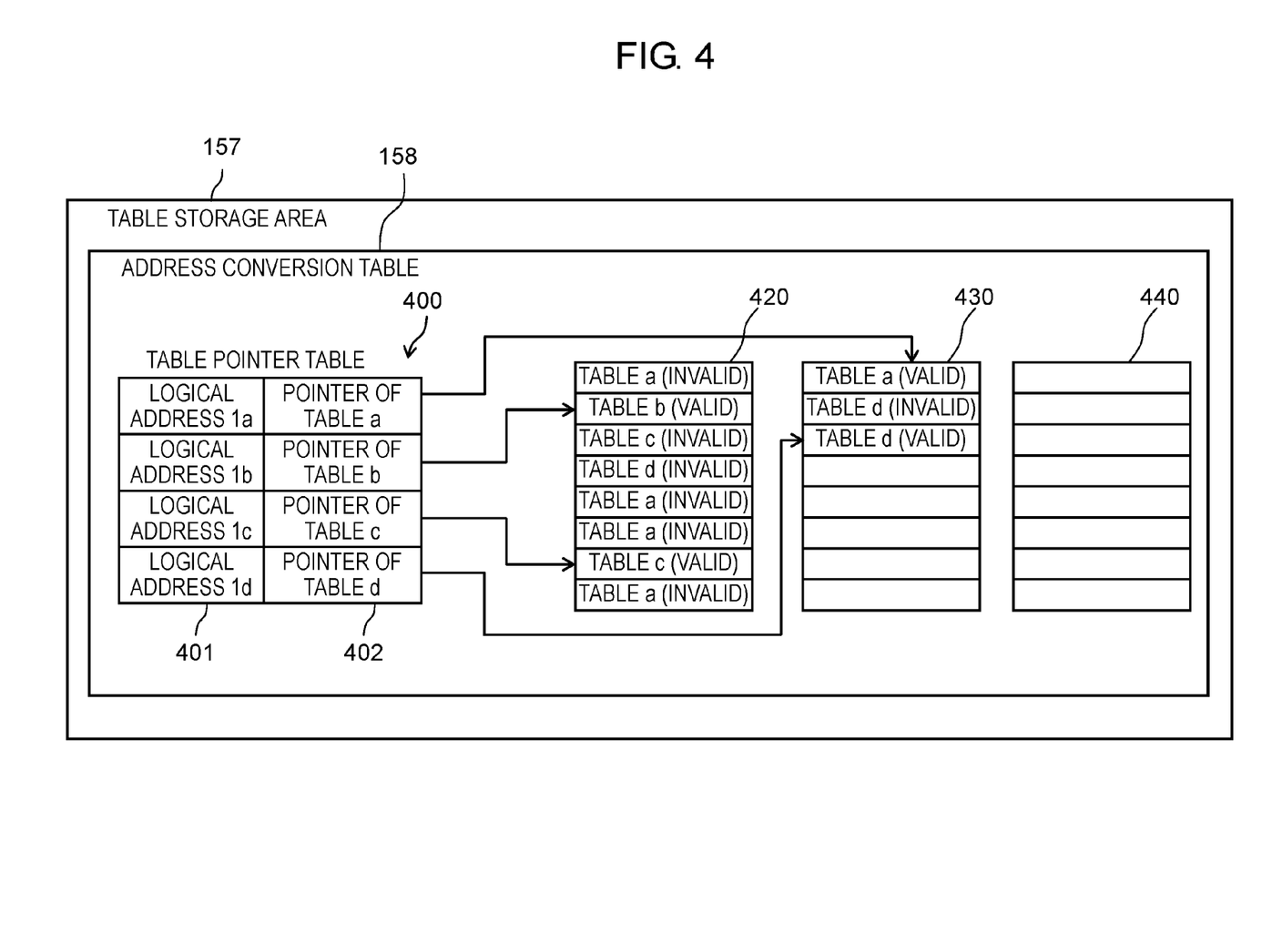
FIG. 4 is a diagram showing an outline of a structure of an address conversion table in the first exemplary embodiment.

FIG. 4 is information held as the data in address conversion table 158. Here, as one example, one of the table storage areas 157 includes table pointer table 400 and three blocks 420 to 440 to configure address conversion table 158. Address conversion table 158 is logically divided into four update unit tables a to d. Furthermore, each of the update unit tables has a plurality of entries. Each of the entries has management data for converting between a logical address and a physical address. As illustrated, contents of update unit tables a to d are held, using block 420 and block 430 of blocks 420 to 440. The contents of seven update unit tables of the stored contents of table storage areas 157 are invalid. Valid update unit table a and valid update unit table d are stored in block 430. Moreover, valid update unit table b and valid update unit table c are stored in block 420. Storage locations of the valid contents relating to update unit tables a to d can be specified by pointers 402 held in table pointer table 400. In the example of FIG. 4, each of pointers 402 held in table pointer table 400 is associated with a logical address, and searching is performed by using at least part of the logical address as index 401. This index 401 may be configured by a common high-order bit to each of the logical addresses included in the entries each configuring the update unit table, and be registered in table pointer table 400. The valid tables in blocks 420 to 440 can be detected, for example, by sequentially searching for the valid entries from heads of the blocks.

Figure 5:
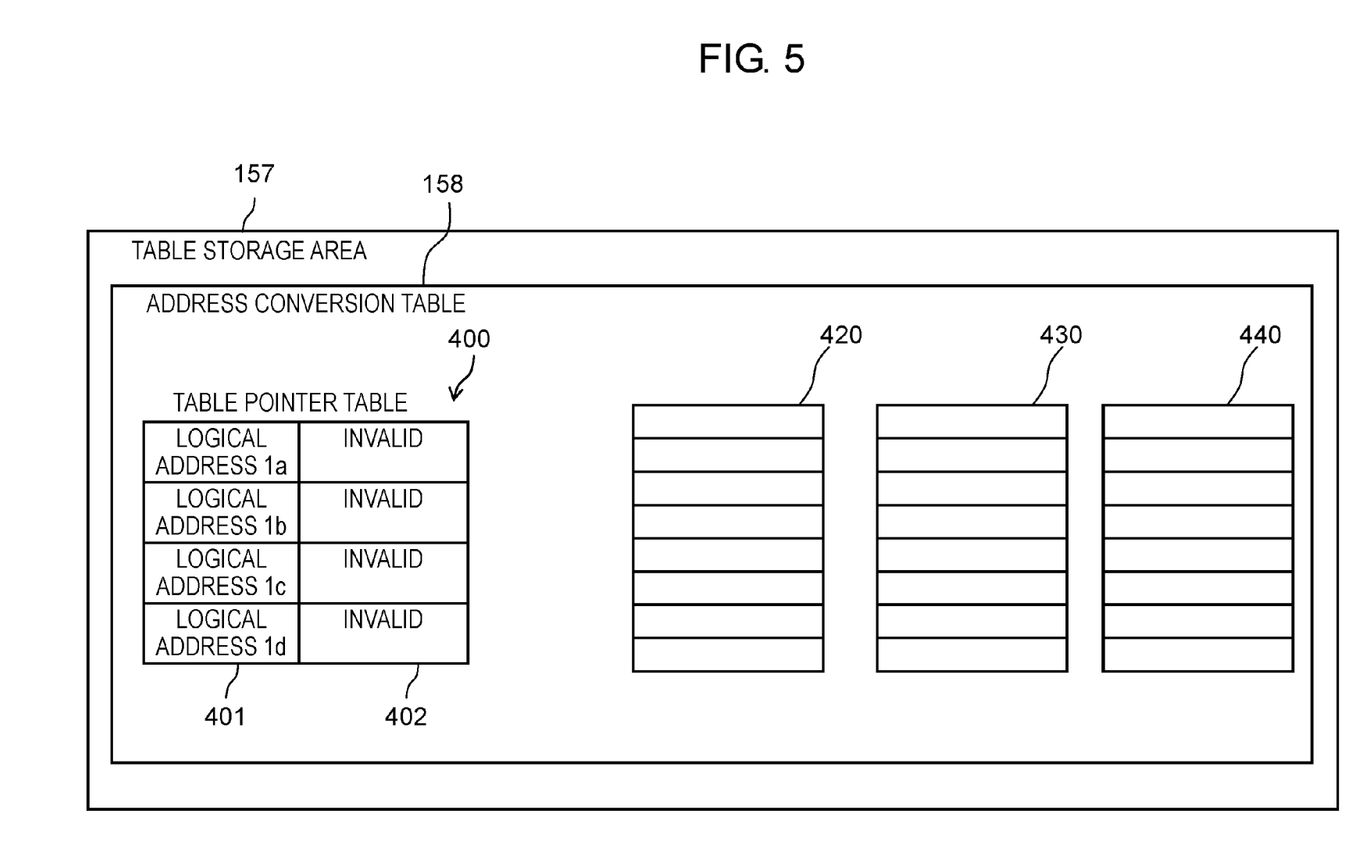
FIG. 5 is an outline of the structure of the address conversion table after initialization in the first exemplary embodiment.

Next, update of the information in the table initialization processing will be described. FIG. 5 shows the information held in address conversion table 158 after the table initialization processing is performed. In order to initialize only pointers 402 of table pointer table 400, table pointer table 400 is generated in a new area in table storage areas 157. This allows the contents of pointers 402 to be reset, so that all the past writing can be invalidated for new writing. This processing can be performed at a high speed because the writing in only table pointer table 400 suffices.

[1-2. Operation]

[1-2-1. Sequence Between Host Device and Recording Device]

Figure 6:
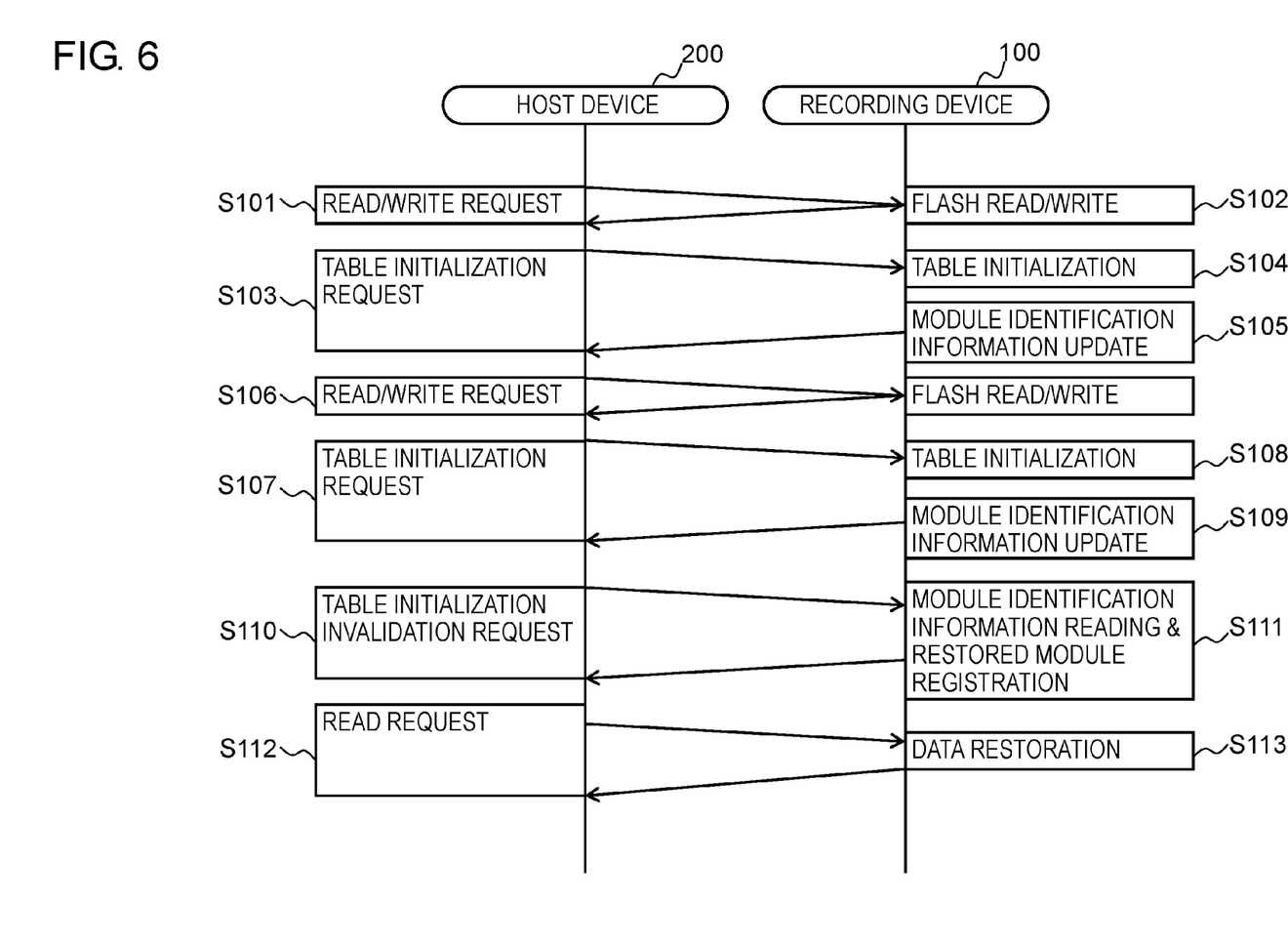
FIG. 6 is a sequence diagram showing operation of the information processing device in the first exemplary embodiment.

FIG. 6 shows a sequence of operation between host device 200 and recording device 100.

Host device 200 issues a Read/Write request to recording device 100 at the time of normal reading or writing (S101). Namely, the Read request is issued at the time of reading, and the Write request is issued at the time of writing. Recording device 100, which has received the Read/Write request, performs the reading or writing to storage modules 150 in response to the request, and notifies host device 200 of the completion (S102). At the time of reading, recording device 100 returns the data read from storage module 150 to host device 200 together with the notification of the completion. At the time of writing, the writing data and the parity data generated in parity generator 121 are written in each of storage modules 150. Furthermore, at the time of writing, address conversion table 158 in flash memories 156 is updated in accordance with the writing content in the user data storage area at the time of writing.

Next, a case where host device 200 issues a table initialization request to recording device 100 will be described (S103). Upon receiving the table initialization request from host device 200, storage module selector 126 selects storage module 150 to be subjected to table initialization from storage modules 150A to 150E. Storage module selector 126 acquires identification information of storage module 150 initialized the last time from management information storage 130, selects storage module 150 other than storage module 150 initialized the last time as storage module 150 to be subjected to the table initialization. Address conversion table initializer 125 issues an initialization request to selected storage module 150. In storage module 150 that has received the initialization request, table initializer 153 executes the table initialization processing (S104). Initialization controller 124 causes management information storage 130 to store the identification information for identifying initialized storage module 150, and to notify host device 200 of the completion of the module initialization (S105). Thereafter, host device 200 performs the normal reading and writing processing as needed (S106).

Next, a case where host device 200 issues an erroneous table initialization request will be described (S107). Recording device 100 performs the processing equivalent to above-described processing S104 for the address conversion table initialization and module identification information update S105 (S108, S109). In order to restore data lost in this erroneous address conversion table initialization, host device 200 issues, to recording device 100, an address conversion table initialization invalidation request, that is, a request for cancelling the request for initialization of address conversion table 158 (S110). When recording device 100 receives the request, initialization controller 124 reads the identification information for identifying initialized storage module 150 from management information storage 130. Furthermore, in order to restore the data of storage module 150 to be read, initialization controller 124 instructs error detector 122 so that address conversion table 158 treats the data of initialized storage module 150 as an error. Initialization controller 124 then notifies host device 200 of the completion of the table initialization invalidation (S111). Thereafter, host device 200 issues the Read request for performing the normal reading to recording device 100 (S112). Recording device 100, which has received the Read request, causes the error detector 122 to determine, as an error, the reading of the data from storage module 150 whose address conversion table 158 has been erroneously initialized. Based on this determination, data restorer 123 restores normal data, using the data and the parity data of storage modules 150 other than storage module 150 erroneously initialized. The restored data is transmitted to host device 200 (S113).

[1-2-2. Data Restoration Processing]

Figure 7:
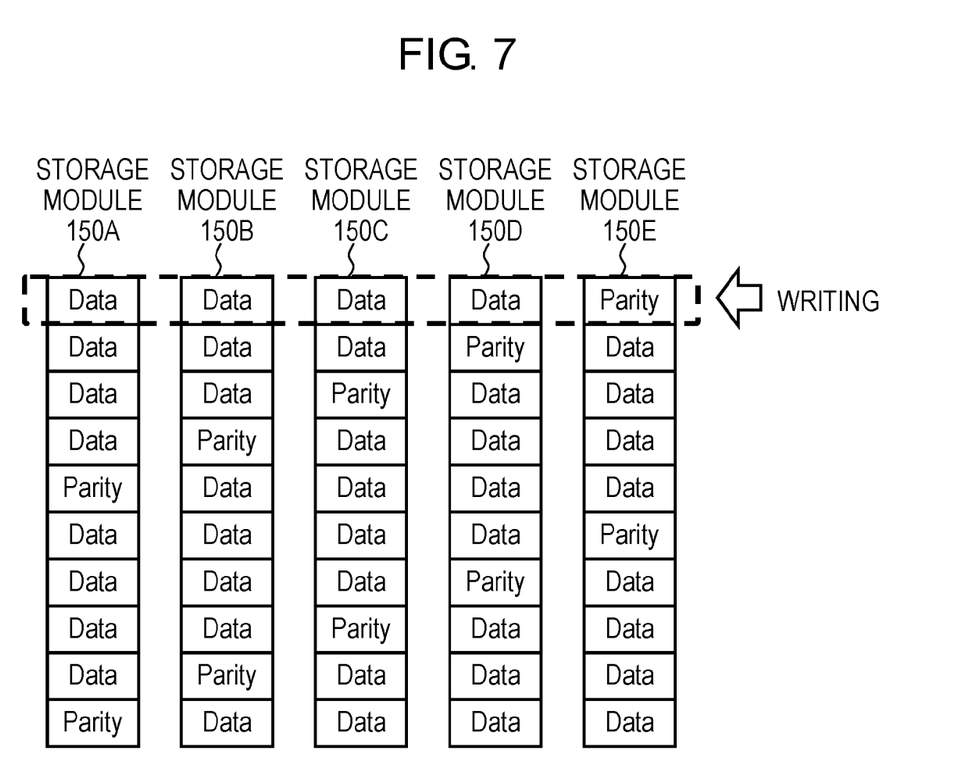
FIG. 7 is a diagram for describing a data recording method for performing data restoration processing using parity data in the first exemplary embodiment.

FIG. 7 is a diagram for describing data recording method for performing data restoration processing, using the parity data. This operation is a technique of enhancing reliability of hard disk, based on a method of RAID (Redundant Arrays of Inexpensive Disks). Here, combining a plurality of pieces of hard disk allows operation as a virtual one piece of hard disk, and a redundant configuration enhances reliability.

Recording device 100 generates the parity data for data restoration in parity generator 121 with respect to a writing request from host device 200. Furthermore, the generated parity data and the writing data from host device 200 are written in storage modules 150A to 150E in an equal size. Recording device 100, for example, performs the writing in a sector (512 bytes) unit, in a page size (4K bytes) unit of the flash memories. As one example, as shown in FIG. 7, recording device 100 divides the writing data from host device 200 into four to write the divided data in respective storage modules 150A to 150D. Additionally, the parity data is generated from the divided four pieces of data, and is written in one remaining storage module 150E. In order to enhance the reliability, recording device 100 sequentially changes storage module 150 in which the parity data is written in this writing processing. Even if one piece of data of five storage modules 150 including the parity data becomes an error, the data, which has become the error, can be restored from the other four storage modules 150.

Figure 8:
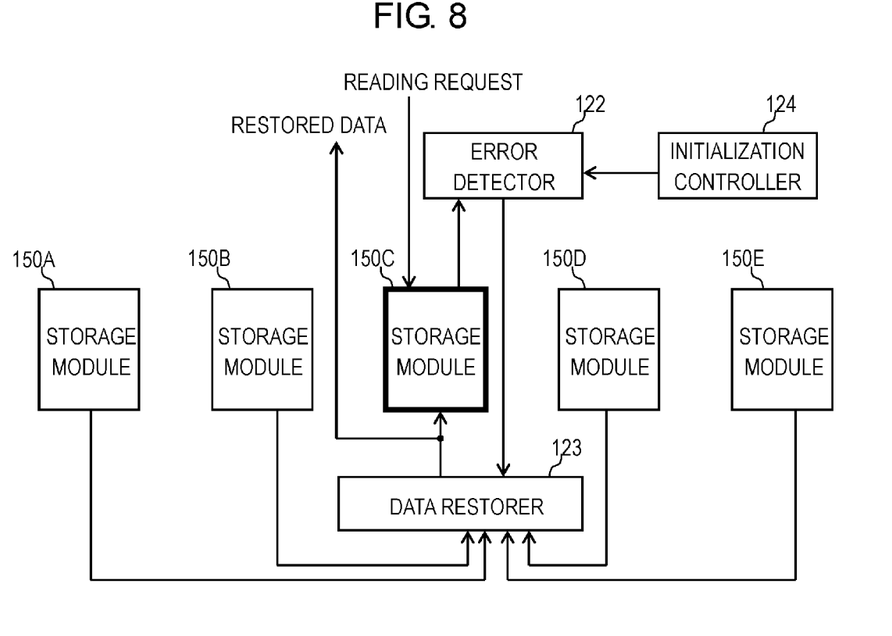
FIG. 8 is a diagram for describing processing at the time of data restoration in the first exemplary embodiment.

FIG. 8 is a diagram for describing a case where the restoration is performed from the erroneous address conversion table initialization. FIG. 8 shows an example when address conversion table 158 of storage module 150C is erroneously initialized. In this case, based on the instruction from initialization controller 124, error detector 122 is sure to determine the data read from storage module 150C as an error with respect to the reading request to storage module 150C. Error detector 122 notifies data restorer 123 that the reading from storage module 150C has been the error. Data restorer 123 restores the data of storage module 150C by the data and the parity data read from storage modules 150 other than storage module 150C.

[1-3. Effects]

As described above, in the first exemplary embodiment, recording device 100 includes the plurality of storage modules 150, recording controller 120 that controls the plurality of storage modules 150, and management information storage 130 that holds the identification information for identifying each of the plurality of storage modules 150.

Storage modules 150 each include flash memories 156 and flash memory controller 152. Each of the flash memories 156 has table storage areas 157 that holds the data of address conversion table 158, and user data storage area 159 that holds the user data. Flash memory controller 152 performs the reading and the writing of the data of flash memories 156, and initializes address conversion table 158.

Recording controller 120 has parity generator 121, error detector 122, data restorer 123, and initialization controller 124. Initialization controller 124 has address conversion table initializer 125 and storage module selector 126.

Parity generator 121 generates the parity data corresponding to the writing data with respect to the writing request of the data, and writes the generated parity data in any of the plurality of storage modules 150.

Error detector 122 detects an error of the data read from each of the plurality of storage modules 150 as the reading objects with respect to the reading request of the data.

When the error detector 122 detects an error, data restorer 123 restores the data of storage module 150 with the error detected, using the data and the parity data read from storage modules 150 other than storage module 150 with the error detected.

Initialization controller 124 specifies storage module 150 as the initialization object, based on the identification information held by management information storage 130 with respect to the initialization request to storage module 150. Initialization controller 124 instructs flash memory controller 152 to initialize address conversion table 158 of specified storage module 150 as the initialization object. Furthermore, initialization controller 124 stores the identification information for identifying storage module 150 as the initialization object in management information storage 130.

Moreover, initialization controller 124 instructs error detector 122 to process, as an error, the data read from storage module 150 as the initialization object corresponding to the identification information held by management information storage 130 with respect to the request for cancelling the initialization request of storage module 150.

This enables the original data to be restored even if the initialization processing of address conversion table 158 is executed by an erroneous trim request.

Other Exemplary Embodiments

As described above, the first exemplary embodiment has been described as illustration of the technique disclosed in the present disclosure. However, the technique in the present disclosure is not limited thereto, but can also be applied to exemplary embodiments in which modifications, replacements, additions, omissions or the like are made. Moreover, the respective components described in the first exemplary embodiment can be combined into a new exemplary embodiment.

Hereinafter, other exemplary embodiments will be described.

While in the first exemplary embodiment, the case where five storage modules 150 are used has been described, a number of storage modules 150 is not limited thereto, and only needs to be plural. Moreover, while in the first exemplary embodiment, the case where one piece of parity data is generated has been described, a number of pieces of parity data is not limited thereto, but a plurality of pieces of parity data may be generated. Moreover, while in the first exemplary embodiment, the case where the four pieces of data and the one piece of parity data are recorded on five different storage modules 150 has been described, the combination of the number of pieces of the data and the number of pieces of the parity data is not limited thereto, but another combination may be employed.

While in the first exemplary embodiment, the example in which the determination of the error of initialized storage module 150 is performed in error detector 122 has been described, the error determination can be implemented by a configuration in which storage module 150 returns error data. For example, the error determination can also be implemented by processing an error correction code given to data so that this data is detected as an error.

In the case where at the time of initialization of address conversion table 158, not only the initialization of address conversion table 158 but physical erasure of storage module 150 is performed, recording device 100 can attain an increase in speed at the time of writing in addition to equivalent effects.

Moreover, recording device 100 can also exert the effects by designating an area of address conversion table 158 to be initialized as a parameter to correspond to only the predetermined area. Specifically, for example, host device 200 issues to recording device 100 an initialization request in which the area of storage module 150 to be initialized is designated by the parameter. Initialization controller 124 specifies storage module 150 as the initialization object, and instructs flash memory controller 152 to initialize the predetermined area in address conversion table 158 of specified storage module 150 as the initialization object. Flash memory controller 152, which has received the instruction, initializes address conversion table 158, and stores the identification information for identifying initialized storage module 150 and information of the initialized area. Furthermore, with respect to a request for cancelling the table initialization request of storage module 150, flash memory controller 152 of specified storage module 150 acquires the identification information and the information of the initialized area of the storage module 150 initialized the last time. An error correction code of this data is processed so that the reading of the data from the initialized area of storage module 150 corresponding to the acquired identification information of storage module 150 is determined as an error.

While in the first exemplary embodiment, storage module selector 126 acquires the identification information of storage module 150 initialized the last time from management information storage 130 to select storage module 150 other than storage module 150 initialized the last time as table initialization object. However, a method for selecting storage module 150 to be initialized is not limited thereto, but another method may be employed. The identification information of storage module 150 initialized the last time may be held, and storage module 150 having a smallest number of times of initialization may be selected as the initialization object. This can bring about leveling of the writing in the flash memories.

Moreover, host device 200 may be sure to execute the initialization of address conversion table 158 when storage module 150 is formatted. Alternately, host device 200 may provide a user interface on display 220, so that the initialization of address conversion table 158 of recording device 100 is executed expressly by the user, or the initialization of address conversion table 158 may be performed when the information processing device is given over to the next user after the use of the information processing device has been completed.

The present disclosure can be applied to electronic equipment that records a video on a recording device. Specifically, the present disclosure can be applied to a camera recorder for business use, a digital still camera, a movie, a versatile personal computer and the like.

What is claimed is:

1. A recording device comprising:
   a plurality of storage modules;
   a recording controller that controls the plurality of storage modules; and a management information storage that holds identification information for identifying each of the plurality of storage modules, wherein each of the storage modules includes:
  a flash memory having a table storage area that holds data of an address conversion table, and a user data storage area that holds data of a user; and
  a flash memory controller that performs reading and writing of the data of the flash memory, and initializes the address conversion table, and the recording controller includes:
  a parity generator that, in response to a request to write data, generates parity data from the data to be written, and writes the generated parity data in any of the plurality of storage modules;
  an error detector that detects an error of data read from each of the plurality of storage modules with respect to a reading request of the data;
  a data restorer that restores the data of one of the plurality of storage modules with the error detected, using the data and the parity data read from some of the plurality of storage modules other than the storage module with the error detected, when the error detector detects the error; and
  an initialization controller,
    with respect to an initialization request, the initialization controller specifying one of the plurality of storage modules as an initialization object, based on the identification information held by the management information storage, instructing the flash memory controller to initialize the address conversion table of the specified storage module as the initialization object, and storing the identification information for identifying the storage module as the initialization object in the management information storage, and
    with respect to a request for cancelling the initialization request, the initialization controller instructing the error detector to process, as an error, data read from the storage module as the initialization object corresponding to the identification information held by the management information storage.

2. The recording device according to claim 1, wherein with respect to the initialization request, the initialization controller specifies one of the plurality of storage modules to be initialized next, based on the identification information of one of the plurality of storage modules initialized the last time, the identification information being held by the management information storage.

3. The recording device according to claim 1, wherein in the storage module as the initialization object, the flash memory controller initializes the address conversion table, and physically erases the data in the flash memory.

4. The recording device according to claim 1, wherein
  the initialization controller specifies the storage module as the initialization object from the plurality of storage modules when the initialization request is an initialization request in which an area to be initialized is designated,
  the flash memory controller of the specified storage module
    initializes the address conversion table, and stores identification information of the initialized storage module and information of the initialized area with respect to the initialization request, and
    acquires the identification information and the information of the initialized area stored in the flash memory controller of the specified storage module, and processes, as an error, reading of the data from the initialized area of the storage module corresponding to the acquired identification information with respect to the request for cancelling the initialization request.

5. An information processing device comprising:
  the recording device according to claim 1; and
  a host device that issues the writing request of the data, the reading request of the data, the initialization request, and the request for cancelling the initialization request to the recording device.

6. The information processing device according to claim 5, wherein the host device has a user interface, and issues the initialization request of the storage module to the recording device by an instruction from a user.

* * * * *